US011081322B2

(12) United States Patent
Noro et al.

(10) Patent No.: US 11,081,322 B2
(45) Date of Patent: Aug. 3, 2021

(54) FILM FORMING APPARATUS, CLEANING METHOD FOR FILM FORMING APPARATUS AND RECORDING MEDIUM

(71) Applicant: Tokyo Electron Limited, Tokyo (JP)

(72) Inventors: Naotaka Noro, Nirasaki (JP); Toshio Hasegawa, Nirasaki (JP); Tamaki Takeyama, Nirasaki (JP); Shinya Iwashita, Nirasaki (JP); Katsuhito Hirose, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 542 days.

(21) Appl. No.: 15/783,048

(22) Filed: Oct. 13, 2017

(65) Prior Publication Data

US 2018/0108518 A1 Apr. 19, 2018

(30) Foreign Application Priority Data

Oct. 14, 2016 (JP) .............................. JP2016-202771

(51) Int. Cl.
*H01L 21/00* (2006.01)
*C23C 16/00* (2006.01)
(Continued)

(52) U.S. Cl.
CPC .... *H01J 37/32862* (2013.01); *C23C 16/4405* (2013.01); *C23C 16/4412* (2013.01);
(Continued)

(58) Field of Classification Search
None
See application file for complete search history.

(56) References Cited

U.S. PATENT DOCUMENTS 5,902,403 A * 5/1999 Aitani ................. C23C 16/4405
118/715
5,989,345 A * 11/1999 Hatano ............... C23C 16/4485
118/715

(Continued)

FOREIGN PATENT DOCUMENTS

JP 2005-109194 A 4/2005
JP 2008277762 A * 11/2008
(Continued)

Primary Examiner — Sylvia MacArthur
Assistant Examiner — Michelle Crowell
(74) Attorney, Agent, or Firm — Pearne & Gordon LLP

(57) ABSTRACT

A film forming apparatus 1 includes a plasma generating mechanism 47 commonly used for plasmarizing a processing gas and a cleaning gas supplied into a processing vessel 11 in which a vacuum atmosphere is formed; an exhaust device 17 configured to evacuate an exhaust line 61 connected to a processing gas discharge unit 43 while the plasmarization of the cleaning gas is being performed by the plasma generating mechanism 47; a tank 62 provided at the exhaust line 61; and a valve V2 which is provided at the exhaust line 61 between the tank 62 and the processing gas discharge unit 43. The valve V2 is configured to be closed to reduce an internal pressure of the tank 62 and opened to attract the plasmarized cleaning gas into the tank 62 from a processing space 40 through the processing gas discharge unit 43.

8 Claims, 13 Drawing Sheets

(51) Int. Cl.
  *H01J 37/32* (2006.01)
  *C23C 16/505* (2006.01)
  *C23C 16/455* (2006.01)
  *C23C 16/44* (2006.01)
  *C23C 16/458* (2006.01)
  *C23C 16/50* (2006.01)

(52) U.S. Cl.
  CPC ........ *C23C 16/455* (2013.01); *C23C 16/4586* (2013.01); *C23C 16/45542* (2013.01); *C23C 16/45565* (2013.01); *C23C 16/50* (2013.01); *C23C 16/505* (2013.01); *H01J 37/3244* (2013.01)

(56) References Cited

U.S. PATENT DOCUMENTS

| | | | |
|---|---|---|---|
| 8,397,668 B2 * | 3/2013 | Kobayashi | H01J 37/32082 118/715 |
| 8,791,031 B2 * | 7/2014 | Yoshida | C23C 16/4408 438/758 |
| 2002/0148561 A1 * | 10/2002 | Tetsuhiro | C23C 16/455 156/345.26 |
| 2003/0119328 A1 * | 6/2003 | Fujisato | C23C 16/4405 438/709 |
| 2005/0136657 A1 * | 6/2005 | Yokoi | C23C 16/34 438/680 |
| 2005/0189074 A1 * | 9/2005 | Kasai | H01L 21/6831 156/345.33 |
| 2010/0323512 A1 * | 12/2010 | Matsumoto | C23C 16/40 438/608 |
| 2013/0213575 A1 * | 8/2013 | Kim | H05H 1/46 156/345.44 |
| 2015/0152557 A1 * | 6/2015 | Okura | C23C 16/45561 427/8 |
| 2015/0270119 A1 * | 9/2015 | Yahata | C23C 16/4405 438/758 |

FOREIGN PATENT DOCUMENTS

| | | | | |
|---|---|---|---|---|
| JP | 2010018889 A | * | 1/2010 | ....... C23C 16/45525 |
| JP | 2013076113 A | * | 4/2013 | |

* cited by examiner

FIG. 11
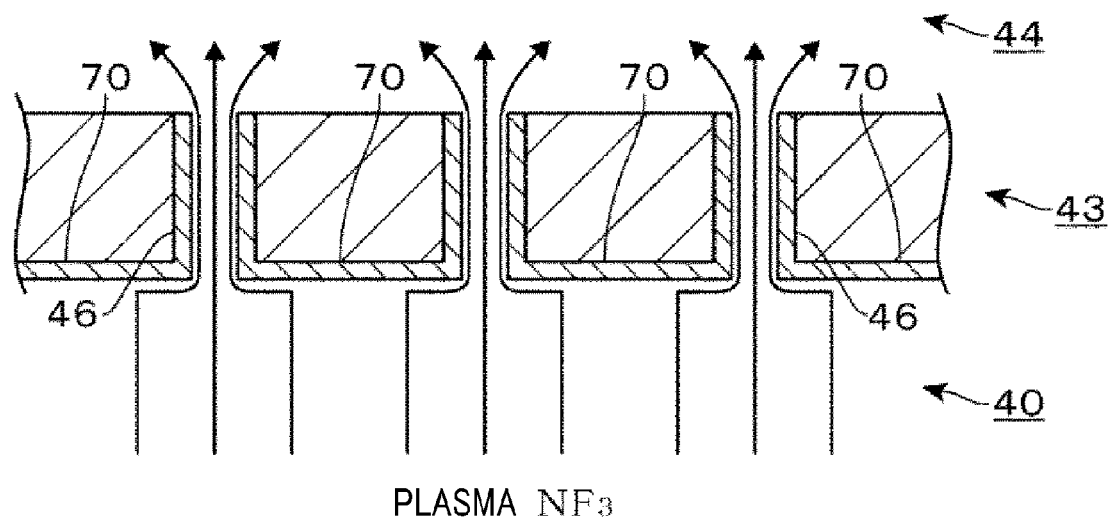
PLASMA NF3
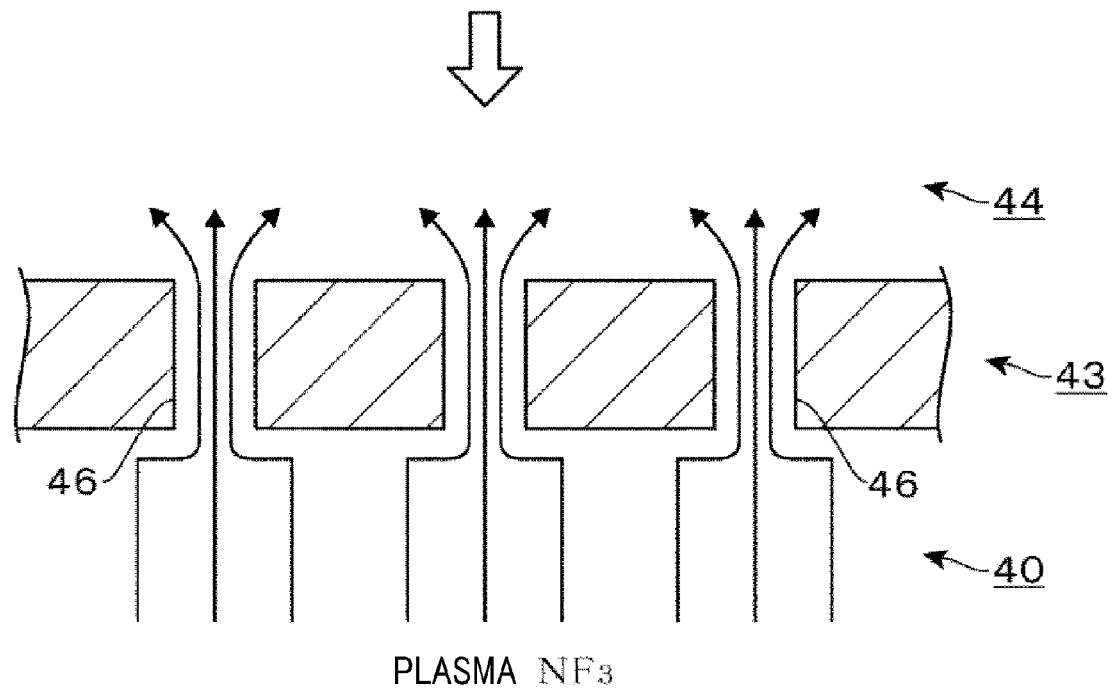
PLASMA NF3

FILM FORMING APPARATUS, CLEANING METHOD FOR FILM FORMING APPARATUS AND RECORDING MEDIUM

CROSS-REFERENCE TO RELATED APPLICATION

This application claims the benefit of Japanese Patent Application No. 2016-202771 filed on Oct. 14, 2016, the entire disclosures of which are incorporated herein by reference.

TECHNICAL FIELD

The embodiments described herein pertain generally to a technique of cleaning the inside of a processing vessel of a film forming apparatus configured to perform a film forming processing on a substrate.

BACKGROUND

In a manufacturing process of a semiconductor device, a film forming processing is performed on a semiconductor wafer (hereinafter, simply referred to as "wafer") as a substrate by ALD (Atomic Layer Deposition), CVD (Chemical Vapor Deposition), or the like. This film forming processing may be performed by using, for example, a film forming apparatus which supplies a processing gas to a wafer placed on a stage from a gas shower head provided within a processing vessel and generates capacitively coupled plasma (CCP) of the processing gas between the gas shower head configured as an electrode plate and the stage in which an electrode plate is provided.

If the film forming processing is performed, a film is formed not only on the wafer but also on various components within the processing vessel into which the processing gas is supplied. Since this film on the components within the processing vessel may cause particle generation, a cleaning processing is performed to remove the film by supplying a cleaning gas into the processing vessel. This cleaning processing needs to be performed rapidly at a relatively low temperature. Thus, it is considered to excite the cleaning gas into plasma.

In the aforementioned film forming apparatus configured to generate the CCP, for example, the apparatus is designed such that the generation of the plasma is suppressed within a hole of the gas shower head to suppress reduction of a diameter of the corresponding hole caused by a film forming processing. If the film forming processing is continued, however, the film may also be formed within the hole of the shower head, and the hole of the shower head needs to be cleaned. That is, within the processing vessel, a region where the CCP is formed does not necessarily coincide with a region where the film is formed and the cleaning processing needs to be performed. In this regard, there has been a demand for a technique capable of removing the film formed at individual components within the processing vessel for a relatively short time without causing damage on the apparatus. Described in Patent Document 1 is a film forming apparatus in which a device configured to excite the cleaning gas into plasma at the outside of the processing vessel is provided separately from a device configured to generate the CCP, and the cleaning gas excited into plasma is supplied to be diffused to the individual components within the processing vessel. Providing such a remote plasma generating device dedicated for the cleaning processing, however, leads to a rise of a manufacturing cost of the apparatus.

Patent Document 1: Japanese Patent Laid-open Publication No. 2005-109194

SUMMARY

In view of the foregoing, exemplary embodiments provide a technique capable of securely removing a film formed within a processing vessel by a processing gas, while suppressing an increase of a manufacturing cost.

In one exemplary embodiment, there is provided a film forming apparatus configured to perform a film forming processing by supplying a plasmarized processing gas onto a substrate. The film forming apparatus includes a mounting unit provided within a processing vessel in which a vacuum atmosphere is formed and configured to mount the substrate thereon; a processing gas discharge unit having a facing surface portion which faces the mounting unit and gas discharge holes opened to the facing surface portion; a cleaning gas supply unit configured to supply a cleaning gas for removing a film formed within the processing vessel; a plasma generating mechanism commonly used for plasmarizing the processing gas and the cleaning gas supplied into the processing vessel; an exhaust device configured to evacuate an exhaust line connected to the processing gas discharge unit while the plasmarization of the cleaning gas is being performed by the plasma generating mechanism; a tank provided at the exhaust line; and a valve which is provided at the exhaust line between the tank and the processing gas discharge unit, and is configured to be closed to reduce an internal pressure of the tank and opened to attract the plasmarized cleaning gas into the tank from a processing space through the processing gas discharge unit.

In another exemplary embodiment, there is provided a cleaning method for a film forming apparatus configured to perform a film forming processing by supplying a plasmarized processing gas onto a substrate. The cleaning method includes supplying a cleaning gas for removing a film formed within a processing vessel from a cleaning gas supply unit; plasmarizing the cleaning gas by a plasma generating mechanism commonly used for the processing gas and the cleaning gas supplied into the processing vessel; evacuating an exhaust line, which is connected to a processing gas discharge unit and provided with a tank, by an exhaust device while the plasmarizing of the cleaning gas is being performed by the plasma generating mechanism; closing a valve, which is provided at the exhaust line between the processing gas discharge unit and the tank, to reduce an internal pressure of the tank; and opening the valve to attract the plasmarized cleaning gas into the tank from a processing space through the processing gas discharge unit.

In still another exemplary embodiment, there is provided a computer-readable recording medium having stored thereon computer-executable instructions that, in response to execution, cause a film forming apparatus configured to perform a film forming processing on a substrate to perform a cleaning method for the film forming apparatus.

According to the exemplary embodiment, the film forming apparatus includes the plasma generating mechanism commonly used for plasmarizing the cleaning gas and the processing gas supplied into the processing vessel; the exhaust device configured to evacuate the exhaust line connected to the processing gas discharge unit; the tank provided at the exhaust line; and the valve provided at the exhaust line between the tank and the processing gas discharge unit. With this configuration, after a relatively large negative pressure is formed by evacuating the tank in the state that the valve is closed, the valve is opened, so that the plasmarized cleaning gas can be attracted to the processing gas discharge unit. Accordingly, the processing gas discharge unit can be cleaned securely. Further, an additional plasma generating mechanism need not be provided, a rise of the manufacturing cost for the film forming apparatus can be suppressed.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 11 is an explanatory diagram illustrating a flow of active species around a shower head of the film forming apparatus;

DETAILED DESCRIPTION

Figure 1:
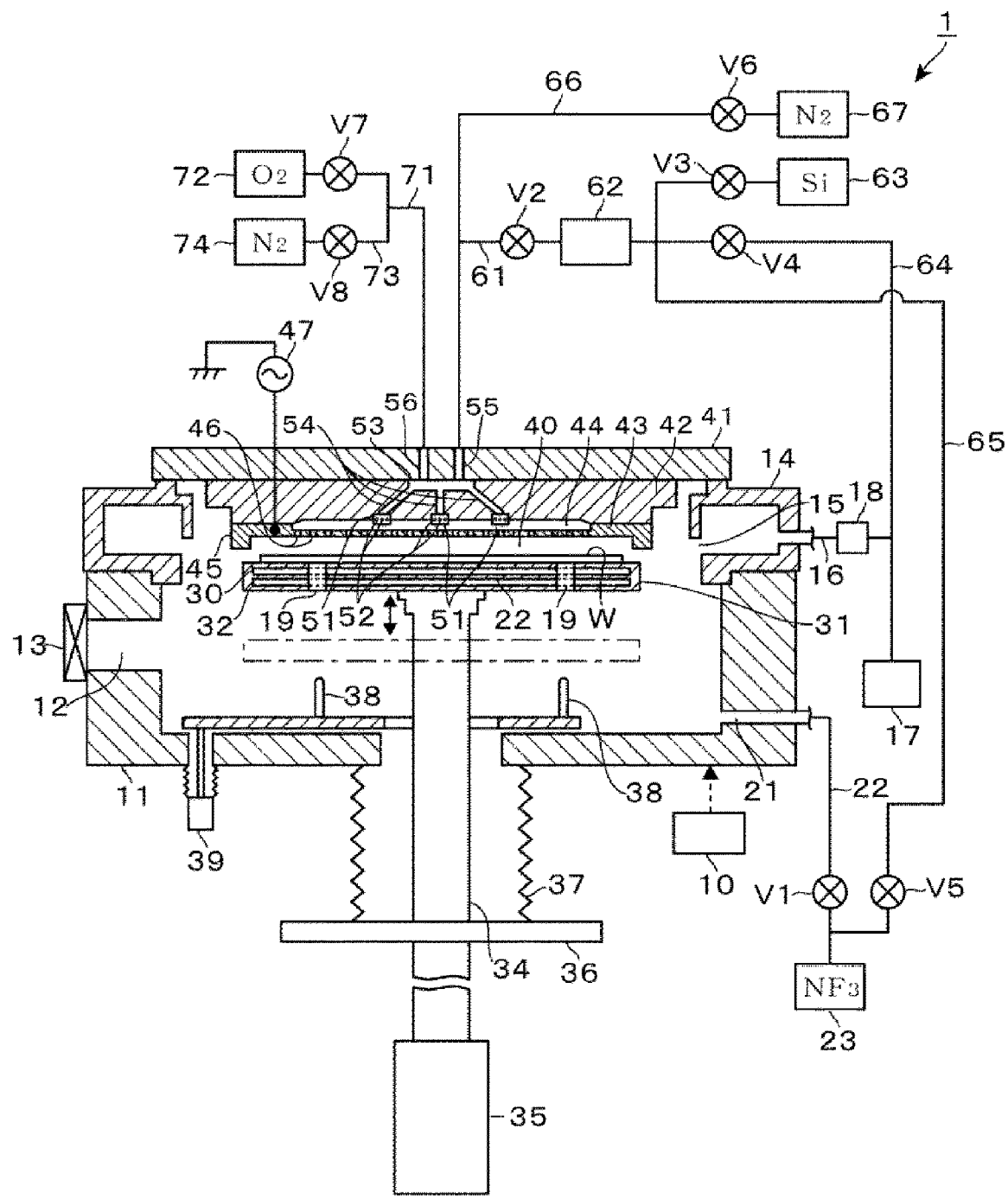
FIG. 1 is a longitudinal cross-sectional side view of a film forming apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

A film forming apparatus 1 according to an exemplary embodiment will be explained with reference to a longitudinal cross-sectional side view of FIG. 1. The film forming apparatus 1 includes a processing vessel 11 as a vacuum chamber in which a wafer W is accommodated and on which a processing is performed. In this film forming apparatus 1, by supplying a Si source gas containing Si (silicon) and an $O_2$ (oxygen) gas as a processing gas alternately into the processing vessel 11 multiple times, a $SiO_2$ (silicon oxide) film is formed on the wafer W by ALD. The Si source gas may be, by way of example, but not limitation, DIPAS (diisopropylaminosilane), HCDS (hexachlorodisilane), TDMAS (tridimethylaminosilane), or BDEAS (bisdiethylaminosilane). The $O_2$ gas as a reactant gas which reacts with the Si source gas is excited into plasma (plasmarized) to be supplied to the wafer W. That is, the film forming apparatus 1 is configured as a plasma ALD apparatus. Further, in the film forming apparatus 1, after a film forming processing is performed by plasma ALD, a $NF_3$ (nitrogen trifluoride) gas as a cleaning gas is supplied into the processing vessel 11, and a cleaning processing of the inside of the processing vessel 11 is performed. This $NF_3$ gas is also excited into plasma (plasmarized).

The processing vessel 11 has a substantially flat circular shape. A non-illustrated heater configured to heat a sidewall of the processing vessel 11 to a preset temperature during the film forming processing and the cleaning processing is provided at the sidewall thereof. Further, a carry-in/out opening 12 for a wafer and a gate valve 13 configured to open/close this carry-in/out opening 12 are provided at the sidewall of the processing vessel 11.

An exhaust duct 14 formed by gently curving an a duct, which has a longitudinal cross section of an angled shape, into a circular ring shape is provided at an upper position than the carry-in/out opening 12. The exhaust duct 14 forms a part of the sidewall of the processing vessel 11. A slit-shaped opening 15 extended in a circumferential direction is formed at an inner peripheral surface of the exhaust duct 14, and this slit-shaped opening 15 forms an exhaust opening of the processing vessel 11. This exhaust duct 14 is connected with one end of an exhaust line 16, and the other end of the exhaust line 16 is connected to an exhaust device 17 which is implemented by a vacuum pump. The exhaust line 16 is provided with a pressure control device 18 implemented by a pressure control valve. This pressure control device 18 is configured to output a detection signal corresponding to a pressure of the exhaust line 16 to a control unit 10 to be described later. That is, the pressure control device is configured as a pressure gauge. The degree of opening of the valve constituting the pressure control device 18 is adjusted based on a control signal from the control unit 10, and a pressure within the exhaust line 16, that is, within the processing vessel 11 is regulated to a required vacuum pressure.

A cleaning gas supply opening 21 for supplying a $NF_3$ gas into the processing vessel 11 is formed at a lower side portion of the processing vessel 11. One end of a supply line 22 configured to supply the $NF_3$ gas into the cleaning gas supply opening 21 is connected to an outer portion of the processing vessel 11, and the other end of the supply line 22 is connected via a valve V1 to a NF$_3$ gas supply source 23 which serves as a cleaning gas supply unit.

A circular mounting table 31 configured to hold a wafer W horizontally is provided within the processing vessel 11. Embedded within the mounting table 31 as a mounting unit are a heater 32 configured to heat the wafer W and an electrode plate 30 which is grounded.

An upper end of a supporting member 34, which is vertically extended and passes through a bottom portion of the processing vessel 11, is connected to a central portion of a bottom surface of the mounting table 31, and a lower end of the supporting member 34 is connected to an elevating device 35. The mounting table 31 can be moved up and down, by the elevating device 35, between a lower position indicated by a dashed dotted line in FIG. 1 and an upper position indicated by a solid line in FIG. 1. The lower position is a transfer position where the wafer W is transferred to/from a transfer device of the wafer which is advanced into the processing vessel 11 through the carry-in/out opening 12. The upper position is a processing position where a processing is performed on the wafer W.

A reference numeral 36 in the figure denotes a flange provided at a portion of the supporting member 34 under a bottom portion of the processing vessel 11. A reference numeral 37 in the figure is an expansible/contractible bellows. An upper end of the bellows 37 is connected to the bottom portion of the processing vessel 11 and a lower end thereof is connected to the flange 36, so that the bellows 37 can secure air-tightness of the inside of the processing vessel 11. A reference numeral 38 in the figure denotes three (only two of them are shown in the drawing) supporting pins, and a reference numeral 39 in the figure represents an elevating device configured to move the supporting pins 38 up and down. When the mounting table 31 is located at the transfer position, the supporting pins 38 are moved upwards or downwards through holes 19 provided in the mounting table 31 to be protruded from or retracted below the top surface of the mounting table 31, so that the wafer W is transferred between the mounting table 31 and the aforementioned transfer device.

A supporting plate 41 is provided on the exhaust duct 14 to cover the inside of the processing vessel 11 from above. A ceiling plate member 42 is provide at a central portion of a bottom surface of the supporting plate 41, and the supporting plate 41 and the ceiling plate member 42 constitute a ceiling portion of the processing vessel 11 together. Further, a circular recess is formed at a central portion of a bottom surface of the ceiling plate member 42. A horizontal plate-shaped shower head 43 is provided under the ceiling plate member 42 to cover the entire bottom surface of the ceiling plate member 42 while facing the mounting table 31. The recess of the ceiling plate member 42 is configured as a flat circular diffusion space 44 in which a gas supplied from gas supply units 51 is diffused as will be described later. The shower head 43 and the bottom surface of the ceiling plate member 42 forming the diffusion space 44 constitute a processing gas discharge unit configured to discharge a processing gas toward the wafer W.

Figure 2:
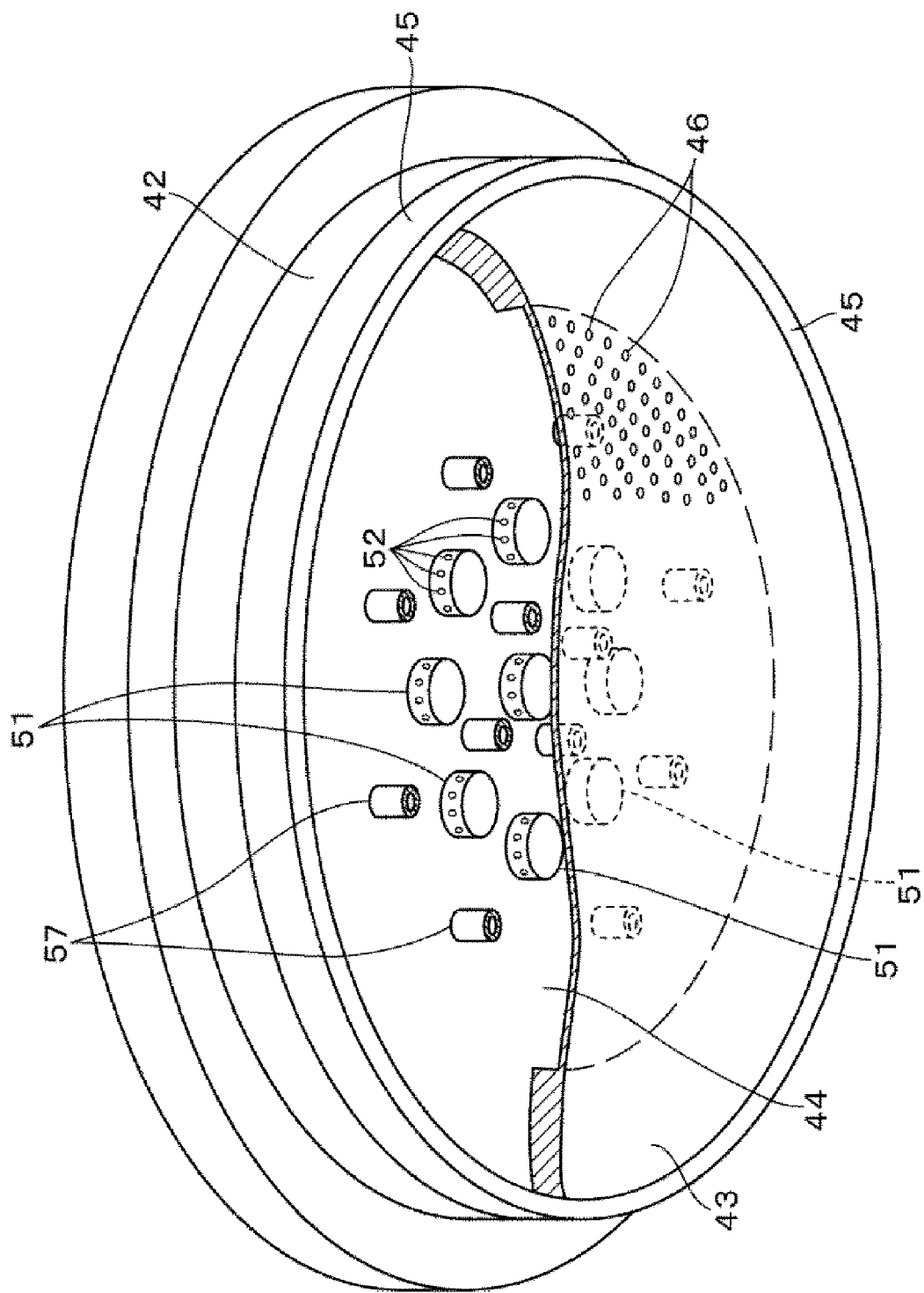
FIG. 2 is a perspective view illustrating a ceiling portion of a processing vessel of the film forming apparatus.

FIG. 2 is a perspective view illustrating the diffusion space 44 by notching a part of the shower head 43. Description will be continued with reference to FIG. 2. A periphery of a bottom surface of the shower head 43 is protruded downwards, which forms an annular protrusion 45, and this annular protrusion 45 is positioned close to the mounting table 31 placed at the processing position. On the bottom surface of the shower head 43, an inner region inside the annular protrusion 45 forms a facing surface portion facing a surface of the wafer W placed on the mounting table 31, and a multiple number of gas discharge holes 46 opened to the diffusion space 44 are distributedly formed in this inner region. Only some of these gas discharge holes 46 are illustrated in FIG. 2.

Further, for example, nine gas supply units 51 are provided at the bottom surface of the ceiling plate member 42 such that they are protruded into the diffusion space 44. Eight among the nine gas supply units 51 are arranged at a regular distance in a circumferential direction of the diffusion space 44, and the rest one is provided at a central portion of the diffusion space 44 to be spaced apart from the other eight gas supply units 51. Each gas supply unit 51 has a circular shape, and a multiple number of gas supply openings 52 are opened in a horizontal direction at a lateral surface thereof at a regular distance along a circumferential direction thereof. A non-illustrated gas inlet opening is formed at an upper portion of each gas supply unit 51, and each gas introduced from the corresponding gas inlet opening is discharged into the diffusion space 44 from the gas supply openings 52 through a flow path formed within the corresponding gas supply unit 51. The gas discharged into the diffusion space 44 is then discharged from the gas discharge holes 46 of the shower head 43. In FIG. 2, a reference numeral 57 denotes a connecting member which connects the shower head 43 and the ceiling plate member 42 in the diffusion space 44.

Referring back to FIG. 1, a space surrounded by the bottom surface of the shower head 43 and the annular protrusion 45 and the top surface of the mounting table 31 serves as a processing space 40 in which the aforementioned film forming processing is performed. Further, the shower head 43 is configured as an electrode plate which makes a pair with the electrode plate 30 of the mounting table 31 and generates the capacitively coupled plasma (CCP) in the processing space 40. The shower head 43 is connected with a high frequency power supply 47 via a non-illustrated matching device. As a high frequency power is supplied from the high frequency power supply 47 to the gas supplied into the processing space 40 through the shower head 43, the CCP is generated. The shower head 43, the electrode plate 30 and the high frequency power supply 47 constitute a plasma generating mechanism and are commonly used in both the cleaning processing and the film forming processing to generate plasma. Further, the high frequency power supply 47 may be connected to the electrode plate 30 of the mounting table 31 instead of the shower head 43, and, in such a case, the shower head 43 may be grounded.

In the drawing, a reference numeral 53 denotes a flat diffusion space provided at an upper central portion of the ceiling plate member 42. A reference numeral 54 is a gas supply path extended and protruded from the diffusion space 53 toward the gas inlet opening of the gas supply unit 51, and this gas supply path 54 is formed for each gas supply unit 51 independently. In the drawing, reference numerals 55 and 56 denote gas supply paths independently formed in the supporting plate 41. Downstream ends of these gas supply paths 55 and 56 are connected to the diffusion space 53. A gas supplied into the gas supply path 55 and a gas supplied into the gas supply path 56 are mixed with each other in the diffusion space 53 and supplied into the gas supply units 51 through the gas supply paths 54. Accordingly, the gas discharged from the shower head 43 into the processing space 40 as stated above is the mixture of the gases respectively supplied through the gas supply paths 55 and 56.

An upstream end of the gas supply path 55 is connected with a downstream end of a gas supply line 61. An upstream end of the gas supply line 61 is connected to a Si source gas supply source 63 via a valve V2, a tank 62 and a valve V3 in this sequence. The tank 62 is provided to store therein a Si source gas and supply, when performing the film forming processing, the Si source gas into the processing space 40 at a relatively high flow rate for a relatively short time period, so that a time required to adsorb the Si source gas to the wafer W can be shortened. Further, as will be described in detail later, as the inside of the tank 62 is evacuated during the cleaning processing, the tank 62 has a function of attracting active species of plasma of a $NF_3$ gas generated in the processing space 40.

One end of an exhaust line 64 and one end of a gas supply line 65 are connected between the valve V3 and the tank 62 at the gas supply line 61, and the other end of the exhaust line 64 is connected between the pressure control device 18 and the exhaust device 17 at the gas supply line 16 via a valve V4. This exhaust line 64 has a function of evacuating the tank 62 as mentioned above. In the aforementioned Si source gas supply source 63, the Si source gas is generated, for example, by vaporizing the corresponding liquid. Accordingly, when, for example, a driving of the apparatus is begun, a concentration of Si contained in the Si source gas supplied into the gas supply line 61 from the Si source gas supply source 63 is instable. The exhaust line 64 also serves to perform evacuation such that the Si source gas is not supplied into the processing space 40 for a time period during which the concentration of the Si is instable.

The other end of the gas supply line 65 is connected between the valve V1 of the supply line 22 and the $NF_3$ gas supply source 23 via a valve V5. Further, one end of a gas supply line 66 is connected to a portion of the gas supply line 61 downstream of the valve V2, and the other end of the gas supply line 66 is connected to a $N_2$ (nitrogen) gas supply source 67 via a valve V6.

An upstream end of the gas supply path 56 of the supporting plate 41 is connected to a downstream end of the gas supply line 71, and an upstream end of the gas supply line 71 is connected to an $O_2$ gas supply source 72 via a valve V7. Further, one end of a gas supply line 73 is connected to a portion of the gas supply line 71 downstream of the valve V7, and the other end of the gas supply line 73 is connected to a $N_2$ gas supply source 74 via a valve V8. Moreover, the $N_2$ gas supply sources 67 and 74 may not be provided separately but may be commonly shared.

The $N_2$ gas is always supplied into the gas supply paths 55 and 56 continuously during the film forming processing. This $N_2$ gas serves as a purge gas for removing the Si source gas or the $O_2$ gas remaining in the processing space 40 when the Si source gas and the $O_2$ gas are not supplied into the gas supply paths 55 and 56. Meanwhile, when the Si source gas and the $O_2$ gas are supplied into the gas supply paths 55 and 56, the $N_2$ gas functions as a carrier gas for introducing the Si source gas and the $O_2$ gas into the processing space 40 stably.

Furthermore, the film forming apparatus 1 is equipped with the control unit 10 implemented by a computer. The control unit 10 includes a program, a memory, a data processing unit implemented by a CPU, and so forth. The program includes commands (steps) whereby the control unit 10 sends control signals to individual components of the film forming apparatus 1 so that the film forming processing and the cleaning processing to be described later can be performed. To be specific, an opening/closing timing of each valve V, an on/off timing of the high frequency power supply 47, a pressure of the processing space 40 by the pressure control device 18, a temperature of the wafer W by the heater 32, a temperature of the processing space 40 by the heater 32 and the heater in the sidewall of the processing vessel 11, and so forth are controlled by the program. This program may be stored in a recording medium such as, but not limited to, a compact disk, a hard disk or a MO (magneto-optical) disk and installed to the control unit 10.

Figure 3:
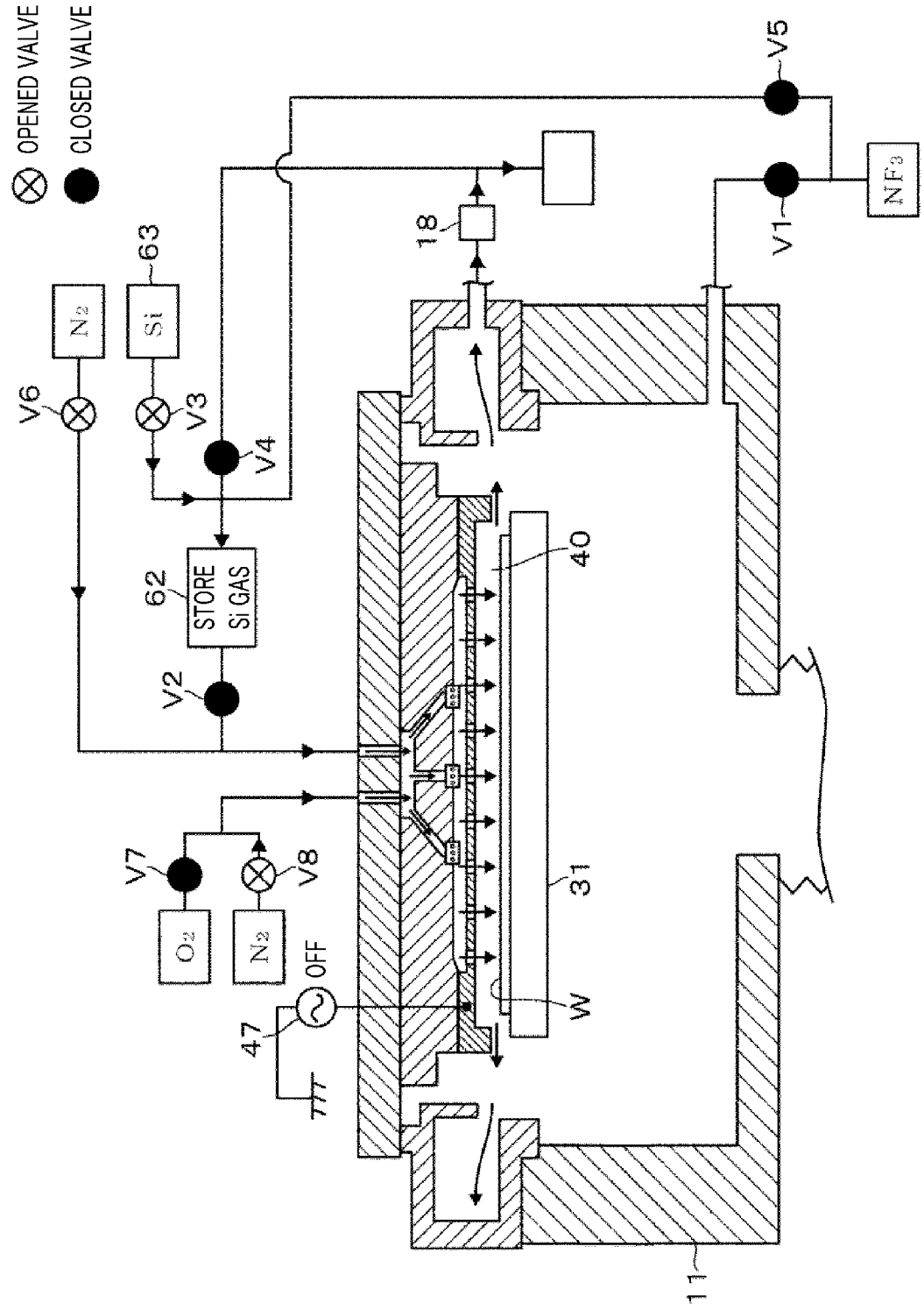
FIG. 3 is an explanatory diagram illustrating opening/closing states of valves in the film forming apparatus.
Figure 4:
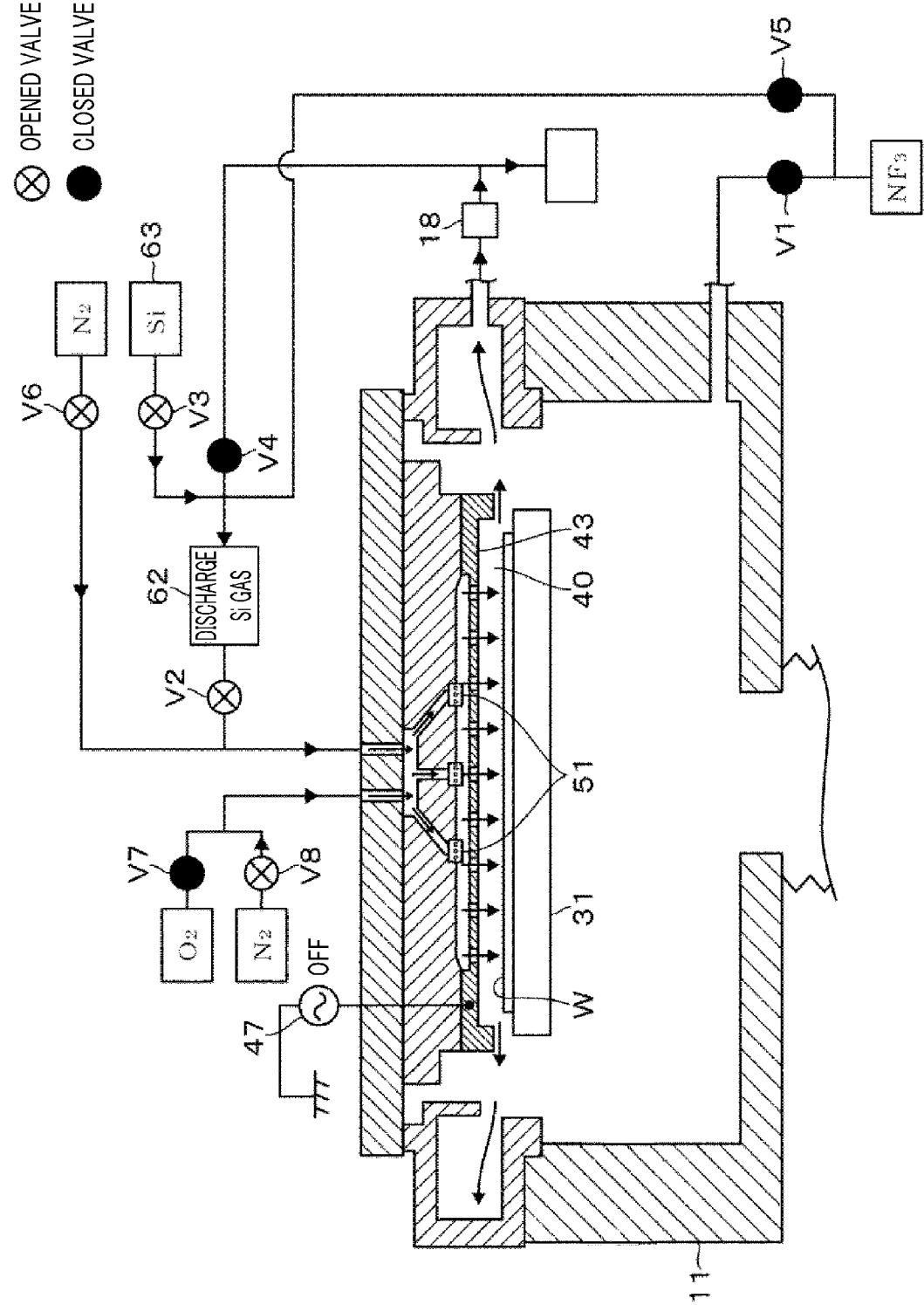
FIG. 4 is an explanatory diagram illustrating the opening/closing states of the valves in the film forming apparatus.
Figure 5:
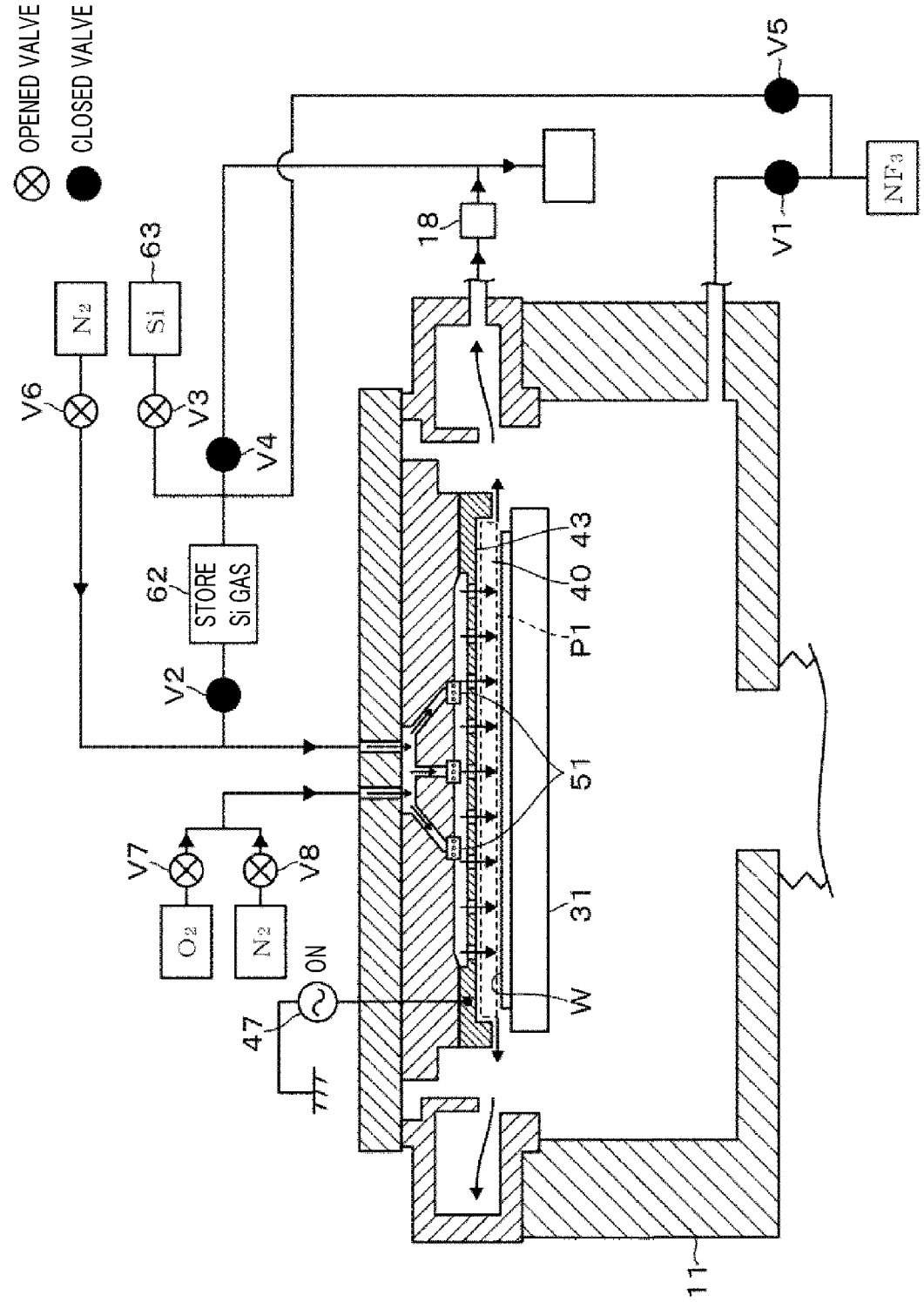
FIG. 5 is an explanatory diagram illustrating the opening/closing states of the valves in the film forming apparatus.
Figure 6:
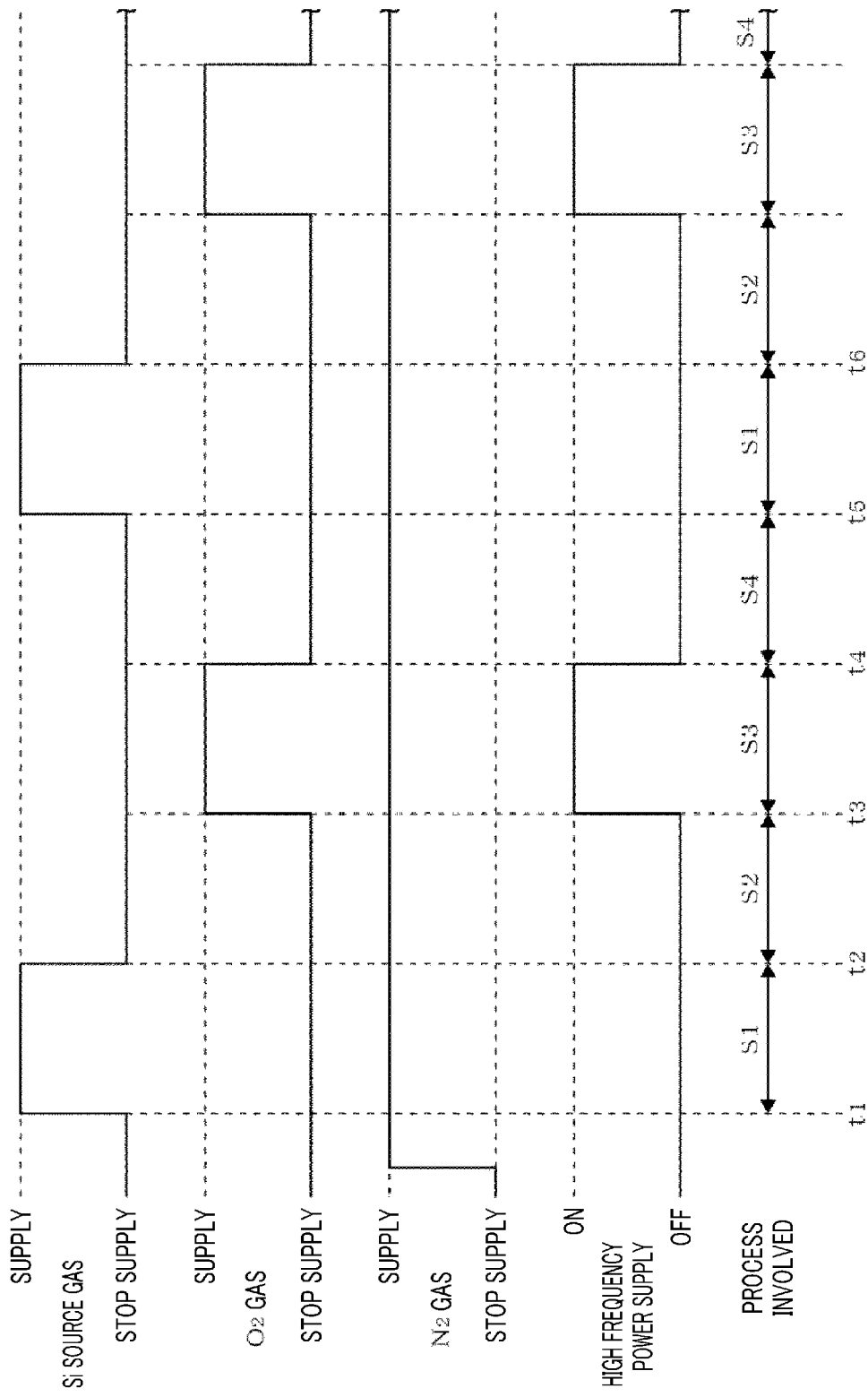
FIG. 6 is a chart showing supply states of individual gases and an on/off state of a high frequency power supply in the film forming apparatus.

Now, a film forming processing performed by the film forming apparatus 1 will be explained with reference to FIG. 3 to FIG. 5 which illustrate opening/closing states of the valves V1 to V8 and an on/off state of the high frequency power supply 47. In FIG. 3 to FIG. 5, the opening/closing state of each of the valves is indicated by allowing the closed valve to be colored black and allowing the open valve to be uncolored. Further, in FIG. 3 to FIG. 5, a flow of each gas is shown by arrows. Further, the following description will be provided with reference to a timing chart of FIG. 6 as well. This timing chart shows a timing when each gas is supplied into the processing vessel 11 and a timing when the supply of each gas is stopped. Further, this timing chart also shows the on/off timing of the high frequency power supply 47 and timings when respective processes S1 to S4 to be described later are performed.

First, from a state where the valves V1 to V8 are closed and the high frequency power supply 47 is turned off, the valves V3 and V2 are opened, and the Si source gas supplied into the gas supply line 61 from the Si source gas supply source 63 is introduced into the processing vessel 11 and then exhausted from the exhaust duct 14. After the concentration of Si contained in the Si source gas is stabilized as this gas exhaust is continued for, for example, a preset time period, the valves V3 and V2 are closed.

Then, after the inside of the processing vessel 11 is evacuated into a vacuum atmosphere of a preset pressure, the gate valve 13 is opened, and a wafer W is transferred by the transfer device to above the mounting table 31 located at the transfer position from a transfer chamber of a vacuum atmosphere adjacent to the processing vessel 11. Then, after the transfer of the wafer W onto the mounting table 31 by the elevation of the supporting pins 38 and the withdrawing of the transfer device from the processing vessel 11 are completed, the gate valve 13 is closed, and the mounting table 31 is moved up to the processing position, so that the processing space 40 is formed. While moving the mounting table 31 up, the wafer W is heated to a predetermined temperature by the heater 32 of the mounting table 31.

The valves V6 and V8 are opened, so that the $N_2$ gas is supplied into the processing space 40. Subsequently, the valve V3 is opened, and the Si source gas is supplied into the tank 62 from the Si source gas supply source 63, so that an internal pressure of the tank 62 is increased (FIG. 3). Then, the valve V2 is opened, and the Si source gas stored in the tank 62 is discharged into the processing space 40 from the shower head 43 through the gas supply units 51 at a relatively high flow rate (time t1) and then adsorbed to the wafer W (FIG. 4, process S1).

Thereafter, the valve V2 is closed, and the supply of the Si source gas from the shower head 43 to the wafer W is stopped (time t2). Then, the Si source gas remaining in the processing space 40 without being adsorbed to the wafer W is purged by the $N_2$ gas supplied from the shower head 43 (process S2). Subsequently, the valve V7 is opened, and the $O_2$ gas is supplied into the processing space 40 from the shower head 43, and the high frequency power supply 47 is turned on (time t3). As a result, the $O_2$ gas in the processing space 40 is excited into plasma, so that plasma P1 is generated. The Si source gas adsorbed to the wafer W is oxidized by this plasma P1, so that an atomic layer of SiO$_2$ is generated as a reaction product (FIG. 5, process S3).

Afterwards, the high frequency power supply 47 is turned off and the valve V7 is closed, so that the generation of the plasma P1 in the processing space 40 and the supply of the O$_2$ gas into the processing space 40 are stopped (time t4). Then, the O$_2$ gas remaining in the processing space 40 and deactivated active species of the plasma are purged by the N$_2$ gas supplied from the shower head 43 and removed from the processing space 40. Here, the opening/closing states of the valves V1 to V8 are as illustrated in FIG. 3 (process S4).

Thereafter, the valve V2 is opened, and the Si source gas is supplied to the wafer W from the shower head 43 through the gas supply units 51 (time t5). That is, the process S1 shown in FIG. 4 is performed. Then, the processes S2 to S4 are performed, and, afterwards, the processes S1 to S4 are performed. As the processes S1 to S4 are repeatedly performed plural times in this way, the atomic layer of SiO$_2$ is deposited on a surface of the wafer W, so that a SiO$_2$ film is formed. If the processes S1 to S4 are repeated preset times, the mounting table 31 is lowered and then the wafer W is carried out of the processing vessel 11 in the reverse sequence to that in which the wafer W is carried into the processing vessel 11. Then, the film forming processing is ended.

If the above-described film forming processing is performed on, for example, a preset number of wafers W, the cleaning processing is performed. This cleaning processing will be described with reference to FIG. 7 to FIG. 9. Like FIG. 3 to FIG. 5, FIG. 7 to FIG. 9 illustrate opening/closing states of the valves, a flow of each gas, and an on/off state of the high frequency power supply 47. Further, the description will be provided with reference to a timing chart of FIG. 10 as well. This timing chart shows a timing when a NF$_3$ gas is supplied into the processing vessel 11 and a timing when the supply of this gas is stopped. Further, this timing chart also shows an on/off timing of the high frequency power supply 47 and timings when processes T1 to T2 to be described later are performed. First, from the state where the valves V1 to V8 are closed, the high frequency power supply 47 is turned off and a wafer W is not placed on the mounting table 31, the mounting table 31 is raised from the transfer position to the processing position, so that the processing space 40 is formed. The inside of the processing vessel 11 is heated to 60° C. to 170° C. by the heater of the processing vessel 11 and the heater 32 of the mounting table 31. Further, an internal pressure of the processing vessel 11 is adjusted by the pressure control device 18 to be turned into a vacuum atmosphere of a preset pressure.

Figure 7:
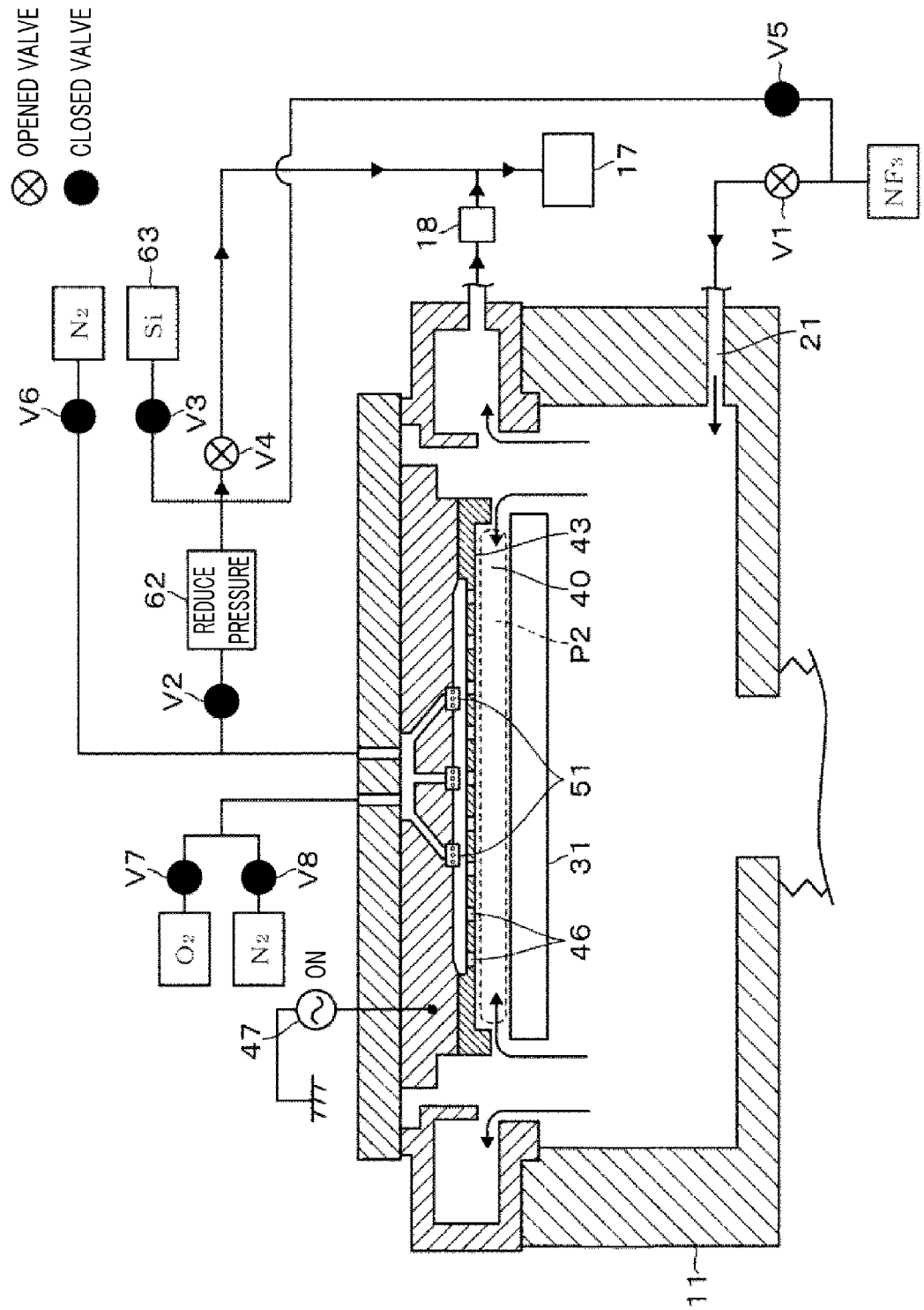
FIG. 7 is an explanatory diagram illustrating opening/closing states of the valves in the film forming apparatus.
Figure 8:
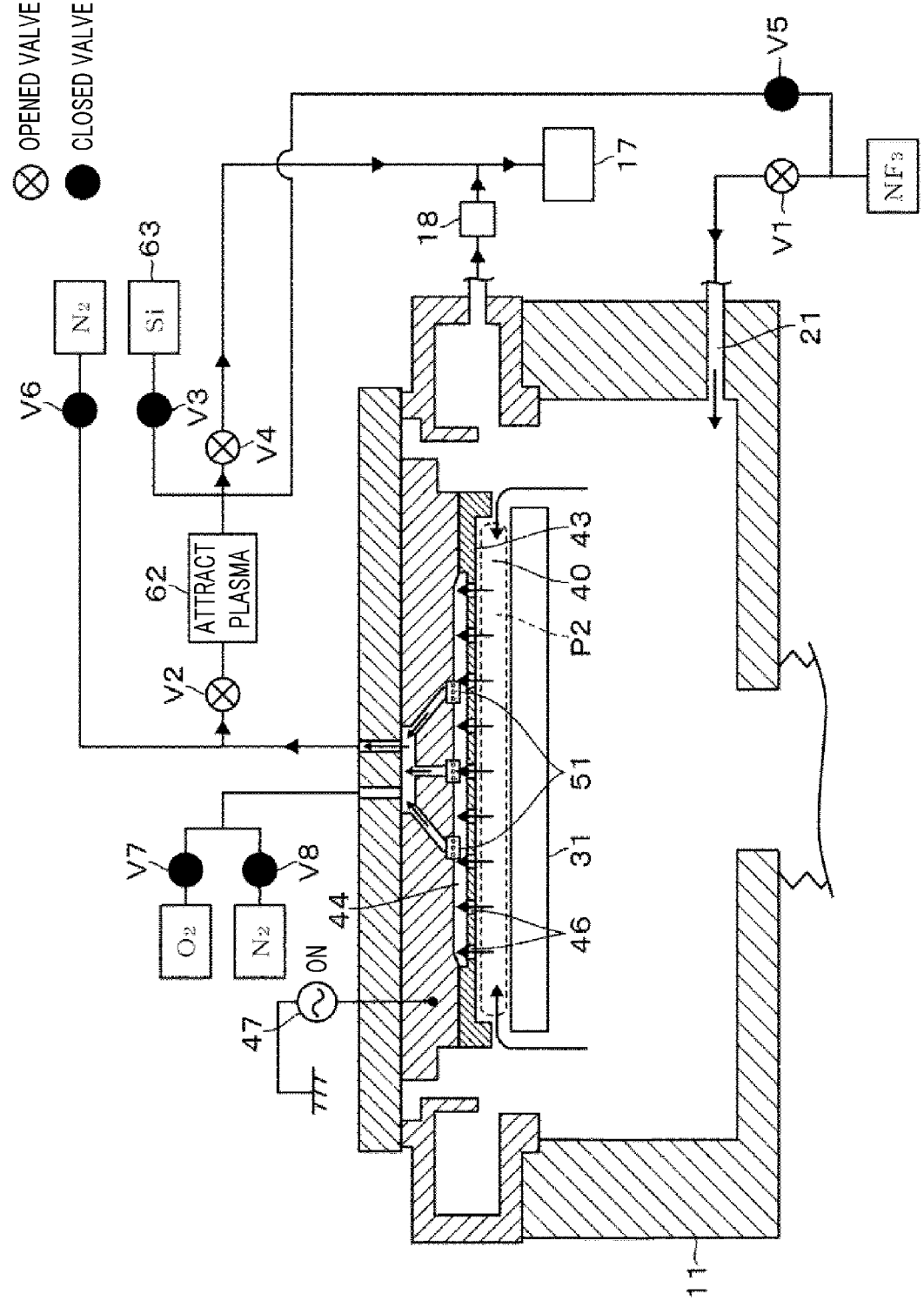
FIG. 8 is an explanatory diagram illustrating the opening/closing states of the valves in the film forming apparatus.

Subsequently, as the valve V1 is opened, the NF$_3$ gas is supplied into the processing vessel 11 from the cleaning gas supply opening 21 and introduced into the processing space 40. The high frequency power supply 47 is turned on (time t11 on the chart of FIG. 10), and plasma P2 of the NF$_3$ gas is generated in the processing space 40. Accordingly, the SiO$_2$ films on the bottom surface of the shower head 43 and the top surface of the mounting table 31 confronting the processing space 40 are removed. Further, along with the generation of the plasma P2, the valve V4 is opened and the inside of the tank 62 is evacuated, so that the internal pressure of the tank 62 is decreased (FIG. 7, process T1). Then, by opening the valve V2 (time t12), the inside of the tank 62 and the processing space 40 are communicated with each other (FIG. 8, process T2). When this valve V2 is opened, the internal pressure of the tank 62 is lower than the pressure of the processing space 40. A difference between the internal pressure of the tank 62 and the pressure of the processing space 40 may be, for example, 67 Pa to 800 Pa.

As stated above, the pressure difference exists between the tank 62 and the processing space 40. As a result, active species such as ions/radicals in the plasma of the NF$_3$ gas flow into the diffusion space 44 through the gas discharge holes 46 of the shower head 43 from the processing space 40 at a relatively high flow rate to make up this pressure difference, and also, are introduced into the tank 62 from the gas supply units 51. FIG. 11 shows the flow of the active species of the NF$_3$ gas around the shower head 43 by arrows when the active species are attracted into the tank 62. As depicted in FIG. 11, by being exposed to the active species of the NF$_3$ gas attracted into the diffusion space 44, a SiO$_2$ film 70 formed on the surface of the shower head 43 including the inside of the gas discharge holes 46 is decomposed to be removed. The active species of the NF$_3$ gas introduced into the tank 62 are removed by being flown into the exhaust device 17 along with the decomposition products of the SiO$_2$ film 70.

As stated above, if a preset time elapses after the valve V2 is opened, the valve V2 is closed (time t13), and the process T1 of reducing the internal pressure of the tank 62 as described in FIG. 7 is performed again. Then, if a predetermined time passes by after the valve V2 is closed, the valve V2 is opened again (time t14), and the process T2 of attracting the active species of the NF$_3$ gas through the shower head 43 as described in FIG. 8 is performed again. Afterwards, the closing and the opening of the valve V2 are repeated in this way multiple times. That is, the processes T1 and T2 are alternately repeated the multiple times. A time period taken until the valve V2 is opened after the corresponding valve V2 is closed, that is, a time period during which the process T1 is performed a single time is, for example, 0.1 sec to 1 sec. A time period taken until the valve V2 is closed after the corresponding valve V2 is opened, that is, a time period during which the process T2 is performed a single time is, for example, 0.1 sec to 1 sec. That is, the opening/closing timing of the valve V2 is controlled based on a preset elapsed time after the corresponding valve is opened and a predetermined elapsed time after the corresponding valve is closed.

Figure 9:
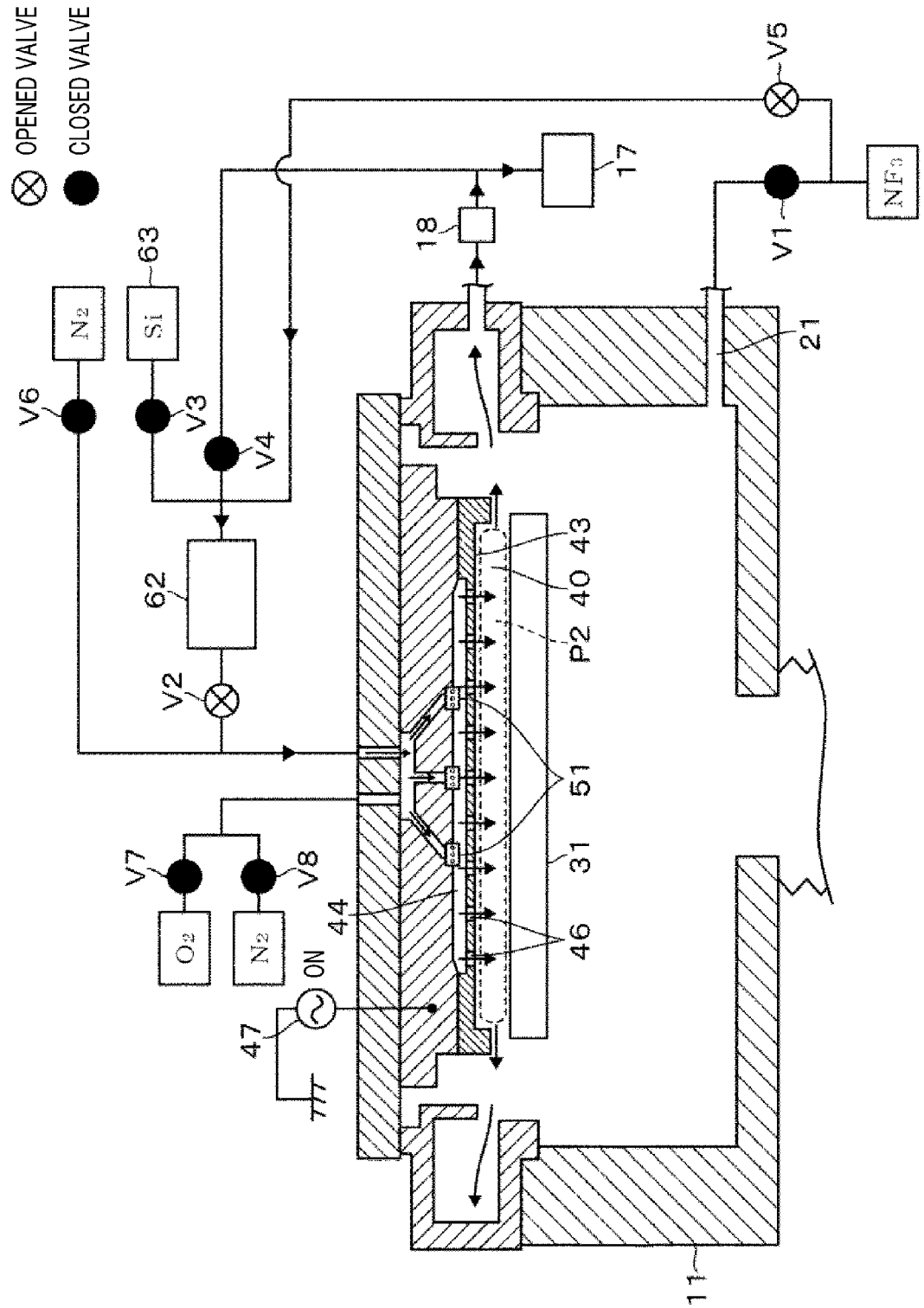
FIG. 9 is an explanatory diagram illustrating the opening/closing states of the valves in the film forming apparatus.
Figure 10:
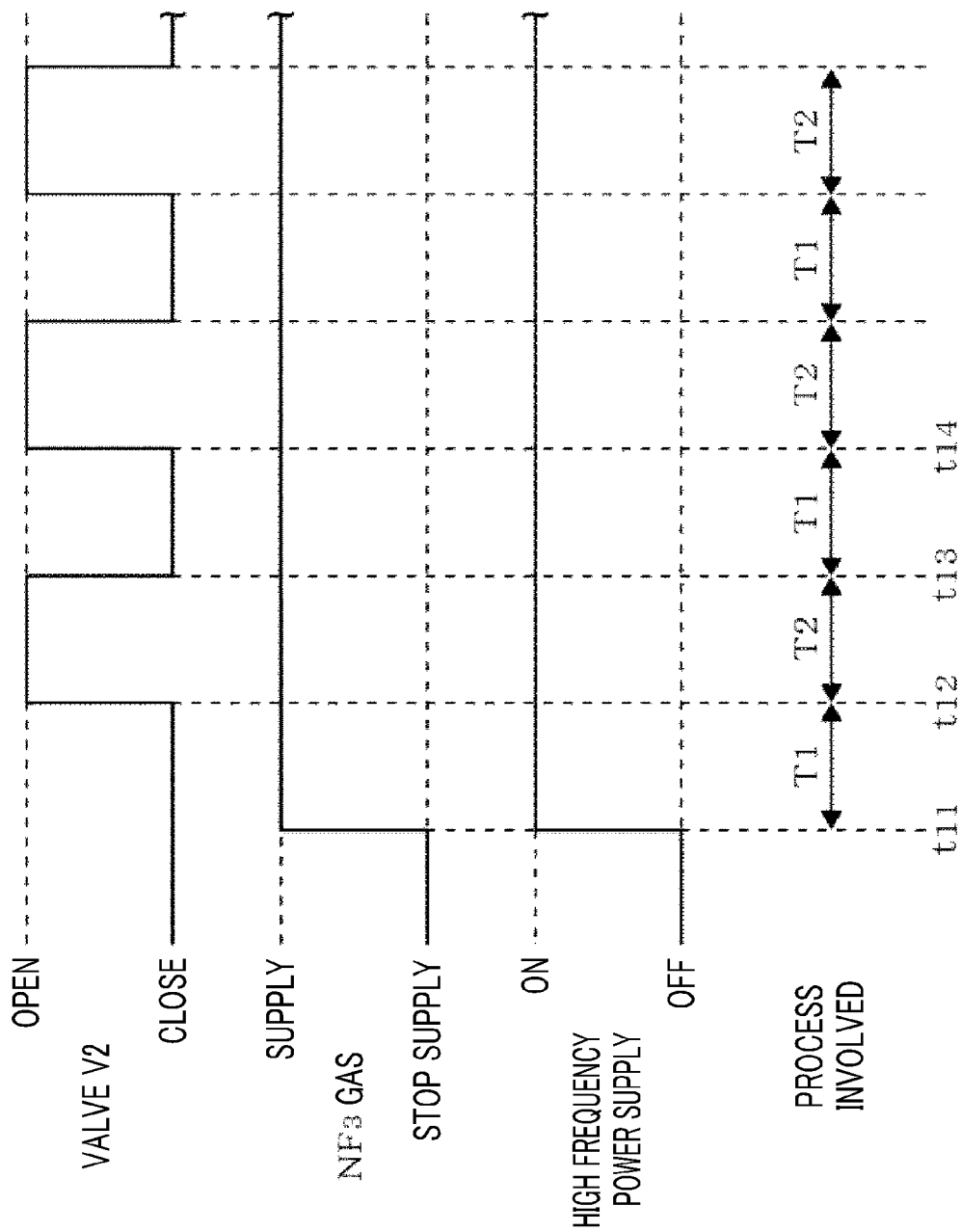
FIG. 10 is a chart showing supply states of individual gases and the on/off state of the high frequency power supply in the film forming apparatus.

If the processes T1 and T2 are repeatedly performed the multiple times, the valve V1 is closed and the high frequency power supply 47 is turned off. Thus, the supply of the NF$_3$ gas into the processing vessel 11 from the cleaning gas supply opening 21 and the generation of the plasma P2 in the processing space 40 are stopped. Further, the inside of the processing vessel 11 is regulated to have a predetermined pressure by the pressure control device 18. Subsequently, as illustrated in FIG. 9, as the valves V2 and V5 are opened, the NF$_3$ gas is supplied into the tank 62, the gas supply units 51 and the diffusion space 44 in sequence and discharged into the processing space 40 from the gas discharge holes 46 of the shower head 43. Further, as the high frequency power supply 47 is turned on, the plasma P2 of the NF$_3$ gas is generated in the processing space 40.

Active species of the NF$_3$ gas constituting the plasma P2 are diffused to the outside of the processing space 40 from a gap between the shower head 43 and the mounting table 31 and is removed by being exhausted from the exhaust duct 14. By being exposed to the active species of the NF$_3$ gas flowing in this way, the SiO$_2$ film formed on the wall surfaces outside the processing space 40 within the processing vessel 11 can be removed. Then, as the valves V2 and V5 are closed and the high frequency power supply 47 is turned off, the generation of the plasma P2 and the supply of the $NF_3$ gas into the processing space 40 are stopped, and the cleaning processing is finished. Thereafter, a next wafer W is carried into the processing vessel 11, and the film forming processing described in the processes S1 to S4 is performed again.

According to this film forming apparatus 1, at the gas supply line 61 connected to the shower head 43 to supply the Si source gas, the valve V2 and the tank 62 are provided in this sequence toward the upstream side thereof. Further, when the plasma of the $NF_3$ gas is generated in the processing space 40, the gas supply line 61 is evacuated through the exhaust line 64 connected to the upstream side of the tank 62 in the gas supply line 61, and the valve V2 is turned into the open state from the closed state. Accordingly, the active species of the plasma generated in the processing space 40 are attracted toward the tank 62 from the gas discharge holes 46 of the shower head 43. Thus, the $SiO_2$ film formed within the gas discharge holes 46 can be removed rapidly and securely.

As stated above, the $SiO_2$ film within the gas discharge holes 46 can be removed by attracting the active species of the $NF_3$ gas. Thus, during the film forming processing, the respective gas discharge holes 46 can be suppressed from having non-uniform diameters caused by the $SiO_2$ film which remains in the gas discharge holes 46 without being removed by the cleaning processing. Accordingly, a film thickness of the $SiO_2$ film formed on the wafer W can be suppressed from being non-uniform in the entire surface of the wafer W. Further, the plasma generating mechanism including the shower head 43, the mounting table 31 and the high frequency power supply 47 to excite the $NF_3$ gas into plasma is also used to excite the $O_2$ gas into plasma to form the $SiO_2$ film. Thus, since it is not necessary to provide additional plasma generating mechanism dedicated for the cleaning processing, the increase of the manufacturing cost of the film forming apparatus 1 can be suppressed.

Moreover, as described above, since the $SiO_2$ film within the gas discharge holes 46 can be securely and rapidly removed, a time required for the cleaning processing can be shortened. Therefore, the individual components within the processing vessel 11 except the inside of the gas discharge holes 46 can be suppressed from being damaged as exposed to and etched by the plasma of the $NF_3$ gas for a long time after the $SiO_2$ films formed on the surfaces of those individual components are removed.

Furthermore, in the film forming apparatus 1, since the evacuation of the tank 62 and the attraction of the active species of the $NF_3$ gas into the tank 62 are repeated multiple times by the opening/closing of the valve V2 during the cleaning processing, a comparatively large amount of the active species can be attracted as shown in an evaluation test to be described later. Thus, the $SiO_2$ film formed within the gas discharge holes 46 can be removed more rapidly and more securely. In addition, the gas supply line 61 used to supply the Si source gas in the film forming processing is used as the exhaust line for evacuating the processing vessel 11 in the cleaning processing. Further, the tank 62 and the valve V2 used to supply the Si source gas into the processing vessel 11 in the film forming processing are used to attract the plasma of the $NF_3$ gas in the cleaning processing. Accordingly, the number of the pipelines, the number of the tank 62 and the number of the valve V2 provided in the film forming apparatus 1 can be reduced. Thus, the manufacturing cost of the film forming apparatus 1 can be cut more securely.

In the cleaning processing of the processes T1 and T2, the gas exhaust from the exhaust duct 14 may not be performed.

To elaborate, by appropriately setting a flow rate of the $NF_3$ gas supplied into the processing vessel 11, a time taken until the valve V2 is opened after closed and a time taken until the valve V2 is closed after opened, the pressure of the processing vessel 40 can be regulated to be higher than the internal pressure of the tank 62 when the valve V2 is opened, so that the attraction of the active species of the plasma into the tank 62 can be achieved.

Moreover, the opening/closing timing of the valve V2 in the cleaning processing may not be limited to being time-controlled as stated above. By way of example, in the cleaning processing, the inside of the processing vessel 11 may be exhausted at a regular exhaust rate by the pressure control device 18. Further, as stated above with reference to FIG. 7, the inside of the tank 62 is evacuated and the plasma of the $NF_3$ gas is generated in the processing vessel 11 while the valve V2 is closed, and then, the valve V2 is opened when the pressure detected by the pressure control device 18 reaches a preset first pressure. Accordingly, the $NF_3$ gas excited into plasma flows into the tank 62. The internal pressure of the processing vessel 11 varies according to the flow of the $NF_3$ gas into the tank 62, and if the pressure detected by the pressure control device 18 reaches a preset second pressure, the valve V2 is closed. Thereafter, if the detected pressure becomes the preset first pressure again, the valve V2 is opened again. In this way, the opening/closing of the valve V2 may be controlled based on the pressure detected by the pressure control device 18.

Figure 12:
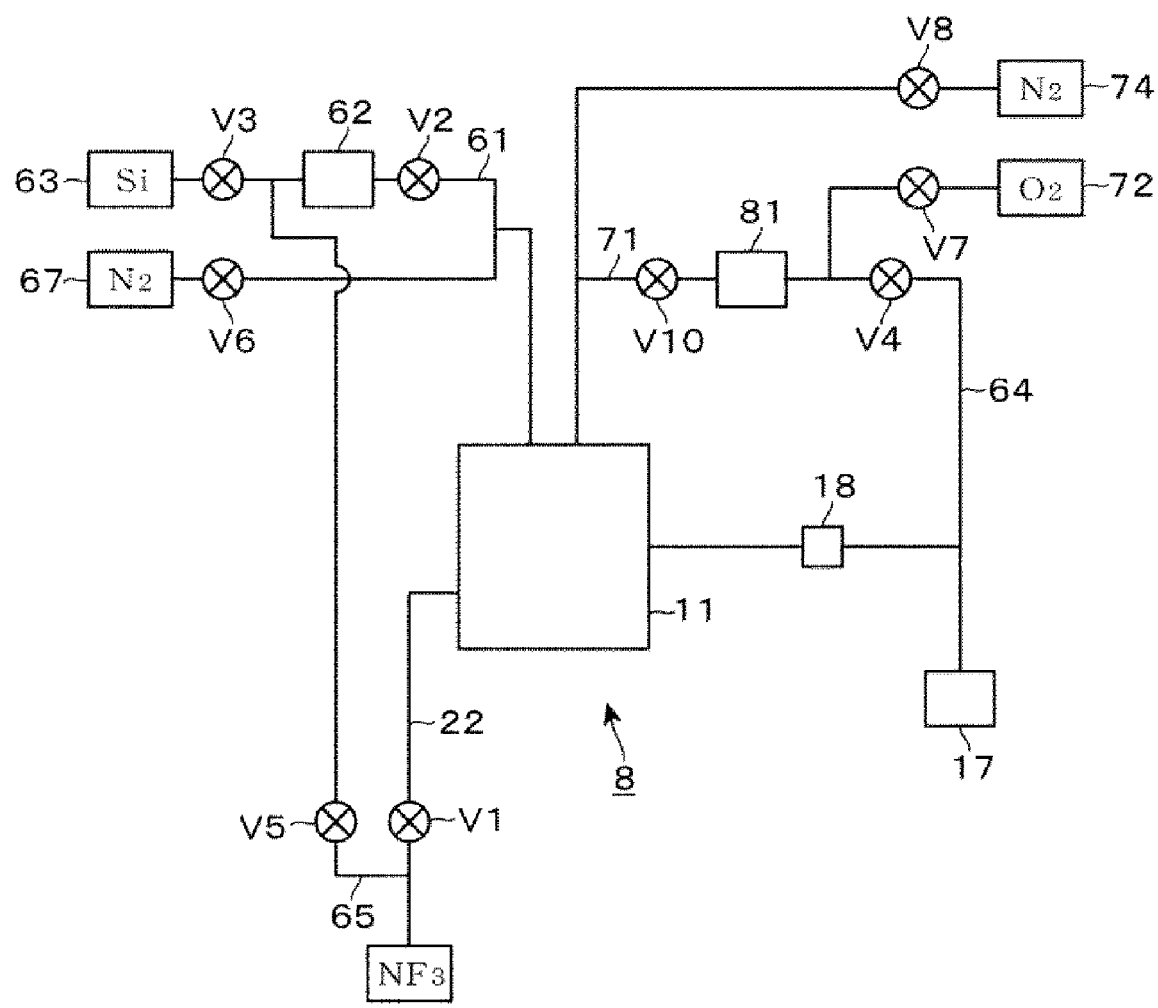
FIG. 12 is schematic diagram illustrating another film forming apparatus according to the exemplary embodiment.

FIG. 12 illustrates a film forming apparatus having a pipeline system different from that of the film forming apparatus 1. The pipeline system of this film forming apparatus 8 is different from that of the film forming apparatus 1 in that a tank 81 and a valve V10 are provided downstream of the valve V7 at the line 71 for supplying the $O_2$ gas into the processing vessel 11 in this sequence toward the processing vessel 11. The tank 81 has the same configuration as that of the tank 62. Further, the upstream end of the exhaust line 64 is connected between the tank 81 and the valve V7 at the gas supply line 71 instead of being connected to the gas supply line 61. In this film forming apparatus 8, the $O_2$ gas is supplied into the processing vessel 11 after being stored in the tank 81, like the Si gas. When the cleaning processing is performed, the valve V10, instead of the valve V2, is opened and closed in the same way as the valve V2 described in FIG. 7 to FIG. 8, so that the cleaning gas excited into plasma is introduced into the tank 81. That is, the gas supply line 71 at which the tank 81 is provided is also used as the exhaust line. In this way, the exemplary embodiment is not merely limited to the configuration of the above-described film forming apparatus 1 in which the tank for attracting the plasma of the cleaning gas is provided at the supply path for supplying the source gas.

Further, the cleaning gas is not limited to the $NF_3$ gas, but a gas such as $ClF_3$ (chlorine trifluoride) gas may be used. By using the $NF_3$ gas, however, the inside of the processing vessel 11 can be cleaned at a relatively low temperature. Thus, it may be desirable to use the $NF_3$ gas. Furthermore, the application of the exemplary embodiment is not limited to an apparatus such as the film forming apparatus 1 configured to perform the plasma ALD, but the exemplary embodiment may also be applicable to an apparatus configured to perform plasma CVD (Chemical Vapor Deposition). Moreover, the facing surface portion facing the wafer W and constituting the processing gas discharge unit may not be implemented by the shower head 43. By way of example, a multiple number of slit-shaped gas discharge openings along the circumferential direction of the wafer W may be provided. That is, the above-described exemplary embodiment is not limiting, and various changes and modifications may be made.

Evaluation Test

Now, an evaluation test conducted according to the exemplary embodiment will be explained. As an evaluation test 1, when the valve V2 is turned into the open state from the closed state in the film forming apparatus 1, a variation of a total flow rate of a gas flowing from the processing space 40 into the gas supply line 61 provided with the tank 62 with a lapse of time is measured through a simulation. If a moment when the valve V2 is turned into the open state from the closed state is defined as an opening moment, the pressures of the gas supply line 61 at the upstream side and the downstream side of the valve V2 at the opening moment are set to be 1 Torr (133.3 Pa) and 6 Torr (800 Pa), respectively. Further, as a comparative test 1, the variation of the total flow rate of the gas flowing from the processing space 40 into the gas supply line 61 in a film forming apparatus with a lapse of time is measured through a simulation. In the film forming apparatus used in this comparative test 1, however, the tank 62 is not provided. Except this difference, conditions of the comparative test 1 are the same as those of the evaluation test 1.

Figure 13:
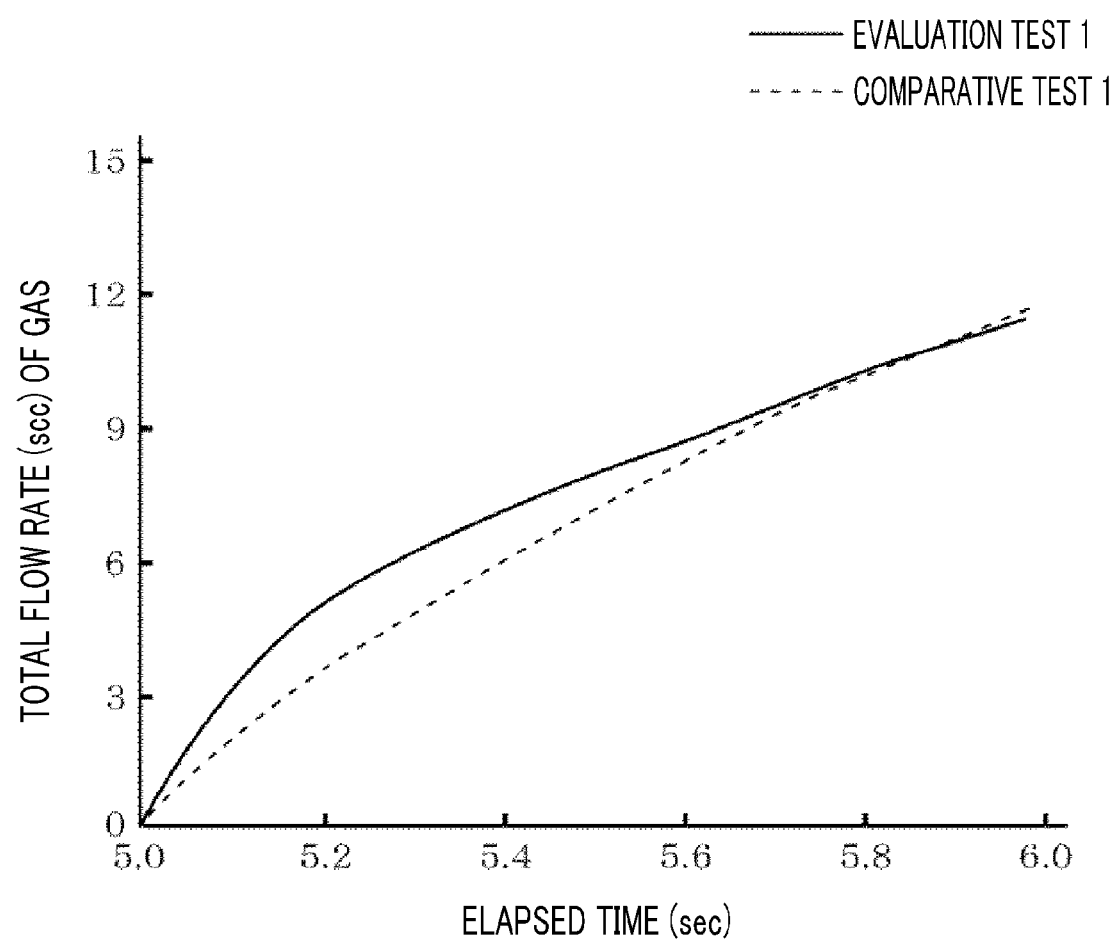
FIG. 13 presents a graph showing a result of an evaluation test.

A graph of FIG. 13 shows results of the evaluation test 1 and the comparative test 1. A horizontal axis of the graph shows an elapsed time with a moment 5 sec before the opening moment set as 0 sec. That is, an elapsed time of 5 sec is the opening moment. A vertical axis of the graph shows the total flow rate (unit: sccm) of the gas flowing from the processing space 40. A result of the evaluation test 1 is indicated by a solid-line graph, and a result of the comparative test 1 is indicated by a dotted-line graph.

As can be seen from FIG. 13, during the elapsed time ranging from 5 sec to 5.8 sec, the total flow rate of the gas in the evaluation test 1 is larger than that of the comparative test 1, whereas the total flow rates of the gas in the evaluation test 1 and the comparative test 1 are substantially same after 5.8 sec. Accordingly, it is found out that the flow rate of the gas attracted to the upstream side of the valve V2 from the downstream side thereof can be set to be large immediately after the opening moment of the valve V2 by providing the tank 62. That is, it is proved that the providing of the tank 62 enables an increase of the attraction amount of the gas into the gas supply line 61 from the processing space 40 immediately after the opening moment. Thus, the effect of the exemplary embodiment is verified from this evaluation test 1. Further, in view of the fact that the total flow rates in the evaluation test 1 and the comparative test 1 are same with a lapse of time immediately after the opening moment, it is found out that by repeating the opening/closing of the valve V2 as stated above at a relatively short cycle, the amount of the active species of the $NF_3$ gas attracted into the tank during the cleaning processing can be increased.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A film forming apparatus configured to perform a film forming processing by supplying a plasmarized processing gas onto a substrate, the film forming apparatus comprising:
    a mounting unit provided within a processing vessel in which a vacuum atmosphere is formed and configured to mount the substrate thereon;
    a processing gas discharge unit having a facing surface portion which faces the mounting unit and gas discharge holes opened to the facing surface portion for discharging a processing gas;
    a cleaning gas supply unit configured to supply a cleaning gas for removing a film formed within the processing vessel;
    a plasma generating mechanism commonly used for plasmarizing the processing gas and the cleaning gas supplied into the processing vessel;
    an exhaust device configured to evacuate an exhaust line connected to the processing gas discharge unit while the plasmarization of the cleaning gas is being performed by the plasma generating mechanism;
    a tank provided at the exhaust line via a first valve, and connected to a processing gas source via a second valve, and connected to the exhaust device via a third valve;
    the first valve which is provided at the exhaust line between the tank and the processing gas discharge unit; and
    a control unit configured to
    control the first valve to open the exhaust line, the second valve to open the processing gas source, and the third valve to close the exhaust device in order to supply the processing gas into a processing space,
    control the first valve to close the exhaust line, the second valve to close the processing gas source, and the third valve to open the exhaust device in order to reduce an internal pressure of the tank by using the exhaust device, and
    control the first valve to open the exhaust line, the second valve to close the processing gas source, and the third valve to open the exhaust device to attract the plasmarized cleaning gas into the tank from the processing space through the processing gas discharge unit by using the exhaust device,
    wherein the exhaust line serves to supply the processing gas and drain the cleaning gas in different time periods.

2. The film forming apparatus of claim 1,
    wherein the film forming processing is performed on the substrate by supplying a source gas and a reactant gas, which serves as the processing gas and forms a reaction product by reacting with the source gas, onto the substrate alternately through the processing gas discharge unit, and
    the tank is provided at a supply line through which the source gas is supplied into the processing gas discharge unit, and the supply line also serves as the exhaust line.

3. The film forming apparatus of claim 1,
    wherein the film forming processing is performed on the substrate by supplying a source gas and a reactant gas, which serves as the processing gas and forms a reaction product by reacting with the source gas, onto the substrate alternately through the processing gas discharge unit, and the tank is provided at a supply line through which the reactant gas is supplied into the processing gas discharge unit, and the supply line also serves as the exhaust line.

4. The film forming apparatus of claim 1,
wherein a switchover of the first valve from a closed state into an open state and a switchover of the first valve from the open state into the closed state are respectively repeated multiple times while the plasmarization of the cleaning gas is being performed by the plasma generating mechanism.

5. The film forming apparatus of claim 1,
wherein the plasma generating mechanism comprises a high frequency power supply configured to generate capacitively coupled plasma by supplying a high frequency power between an electrode provided in the processing gas discharge unit and an electrode provided in the mounting unit.

6. The film forming apparatus of claim 1,
wherein, while the plasmarization of the cleaning gas is being performed, a gas exhaust is performed through an exhaust opening through which a gas exhaust is performed during the film forming processing.

7. The film forming apparatus of claim 6,
wherein opening/closing of the first valve is controlled by using a pressure gauge provided at an exhaust line connected to the exhaust opening.

8. The film forming apparatus of claim 1,
wherein, while the plasmarization of the cleaning gas is being performed, the first valve is closed upon a lapse of a preset time after the first valve is opened, and opened upon a lapse of a predetermined time after the first valve is closed.

* * * * *